(12) United States Patent
Messer et al.

(10) Patent No.: US 10,736,233 B1
(45) Date of Patent: Aug. 4, 2020

(54) SELF-CONTAINED COOLING DEVICE FOR AN ELECTROMAGNETIC INTERFERENCE FILTER

(71) Applicant: The Boeing Company, Chicago, IL (US)

(72) Inventors: Timothy D. Messer, Madison, AL (US); John Dalton Williams, Decatur, AL (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/394,609

(22) Filed: Apr. 25, 2019

(51) Int. Cl.
| | |
|---|---|
| *H05K 7/20* | (2006.01) |
| *H01F 17/06* | (2006.01) |
| *H01F 27/10* | (2006.01) |
| *H01F 27/02* | (2006.01) |

(52) U.S. Cl.
CPC ....... *H05K 7/20272* (2013.01); *H01F 17/062* (2013.01); *H01F 27/025* (2013.01); *H01F 27/105* (2013.01); *H01F 2017/065* (2013.01)

(58) Field of Classification Search
None
See application file for complete search history.

(56) References Cited

U.S. PATENT DOCUMENTS

| | | | | |
|---|---|---|---|---|
| 8,520,390 | B2* | 8/2013 | Okamoto | H01P 1/218 174/544 |
| 9,099,900 | B2* | 8/2015 | Glubrecht | H02K 1/20 |
| 9,537,442 | B2* | 1/2017 | Chretien | H02P 27/08 |
| 10,015,908 | B2 | 7/2018 | Williams et al. | |
| 2007/0205732 | A1* | 9/2007 | Beifus | F04D 27/004 318/432 |
| 2008/0248283 | A1* | 10/2008 | Golner | B29C 44/1209 428/317.9 |
| 2014/0260410 | A1* | 9/2014 | Chretien | H02P 27/08 62/426 |
| 2016/0111923 | A1* | 4/2016 | Bushen | H02K 1/20 310/59 |
| 2018/0123409 | A1* | 5/2018 | Rogginger | H02K 1/185 |

* cited by examiner

*Primary Examiner* — Courtney L Smith

(57) ABSTRACT

A cooling device for an electromagnetic interference filter is disclosed. The cooling device includes a housing. The housing includes a main body having a cavity shaped to receive the electromagnetic interference filter and one or more cooling channels surrounding at least a portion of the cavity in the main body of the housing. The one or more cooling channels define one or more flow paths that are contained completely within the housing. The housing also includes an inlet port and an outlet port. The one or more cooling channels fluidly connect the inlet port to the outlet port, and a cooling medium is configured to flow into the inlet port, through the one or more cooling channels, and exit the housing through the outlet port.

25 Claims, 9 Drawing Sheets

SELF-CONTAINED COOLING DEVICE FOR AN ELECTROMAGNETIC INTERFERENCE FILTER

GOVERNMENT FUNDING

The invention described herein was made in the performance of work under NASA Contract No. NNC15AA01A and is subject to the provisions of Section 305 of the National Aeronautics and Space Act of 1958 (72 Stat.435: 42 U.S.C. 2457).

INTRODUCTION

The present disclosure relates to a cooling device for an electromagnetic interference filter. More specifically, the present disclosure is directed towards a self-contained cooling device having a housing for receiving an electromagnetic interference filter, where the housing includes one or more cooling channels that are contained completely within the housing.

BACKGROUND

Electromagnetic interference represents an electric or magnetic field acting on an electronic device to disrupt operation. Electromagnetic interference is a broad term that encompasses all frequencies in the electromagnetic spectrum such as direct current (DC) and alternating current (AC). When the interference falls within the radio frequency range of the electromagnetic spectrum, then the interference may be referred to as radio frequency interference. It is to be appreciated that any device having electronic circuitry may be susceptible to electromagnetic interference. While electromagnetic interference may be generated from any electronic device, some devices such as, for example, AC motors, microprocessors, and power switching supplies are more likely to create disturbances.

An electromagnetic interference filter is a passive electronic device for suppressing electromagnetic interference. Electromagnetic interference filters include passive components such as capacitors and inductors that are connected together to form a resonant circuit. The inductors allow for lower frequency current to pass through to the load but block higher frequency current. However, the inductors dissipate the higher current as heat. Therefore, in some instances, a cooling system may be required to reduce the operating temperatures of the electromagnetic interference filter. For example, in one approach to reduce the operating temperatures, cooled air is blown over the filter. However, it may be challenging to provide sufficient cooling using this approach, especially when packaging space is limited. Although other approaches for cooling the electromagnetic interference filter exist, these approaches may also have drawbacks. For example, some types of cooling devices may be complex or costly to manufacture. Furthermore, some of cooling devices may be prone to leakage.

SUMMARY

According to several aspects, a cooling device for an electromagnetic interference filter is disclosed. The cooling device includes a housing. The housing includes a main body having a cavity shaped to receive the electromagnetic interference filter and one or more cooling channels surrounding at least a portion of the cavity in the main body of the housing. The one or more cooling channels define one or more flow paths that are contained completely within the housing. The housing also includes an inlet port and an outlet port. The one or more cooling channels fluidly connect the inlet port to the outlet port. The cooling medium is configured to flow into the inlet port, through the one or more cooling channels, and exit the housing through the outlet port.

In another aspect, a cooling system is disclosed. The cooling system includes a source of cooling medium, a pump fluidly connected to the source of cooling medium, an electromagnetic interference filter, and a cooling device. The cooling device is configured to provide cooling to the electromagnetic interference filter. The cooling device includes a housing. The housing includes a main body having a cavity shaped to receive the electromagnetic interference filter and one or more cooling channels that surround at least a portion of the cavity in the main body of the housing. The one or more cooling channels define one or more flow paths that are contained completely within the housing. The housing also includes an inlet port fluidly connected to the source of cooling medium and an outlet port. The one or more cooling channels fluidly connect the inlet port to the outlet port. The pump moves the cooling medium into the inlet port, through the one or more cooling channels, and out of the cooling device through the outlet port.

The features, functions, and advantages that have been discussed may be achieved independently in various embodiments or may be combined in other embodiments further details of which can be seen with reference to the following description and drawings.

BRIEF DESCRIPTION OF THE DRAWINGS

The drawings described herein are for illustration purposes only and are not intended to limit the scope of the present disclosure in any way.

DETAILED DESCRIPTION

The present disclosure is directed towards a self-contained cooling device for an electromagnetic interference filter. The cooling device includes a housing having a cavity shaped to receive the electromagnetic interference filter, an inlet, an outlet, and one or more cooling channels. The cooling channels define one or more flow paths that are contained completely within the housing of the cooling device, where a cryogenic fluid flows through the cooling channels to draw heat generated by the electromagnetic interference filter. In some embodiments, the cooling device includes a cap, however, it is to be appreciated that the cap is optional. The cap further enhances cooling of the electromagnetic interference filter and clamps the busbars of the electromagnetic interference filter, which improves electrical conductivity and isolation.

The cooling device is a self-contained monolithic unit that does not require multiple components. Because the cooling device is self-contained, this eliminates any potential leaks that may form between mating surfaces when multiple components are employed. Additionally, the self-contained cooling device also provides improved dispersion of cryogenic fluid, which in turn results in a more uniform cooling of the electromagnetic interference filter.

The following description is merely exemplary in nature and is not intended to limit the present disclosure, application, or uses.

Figure 1:
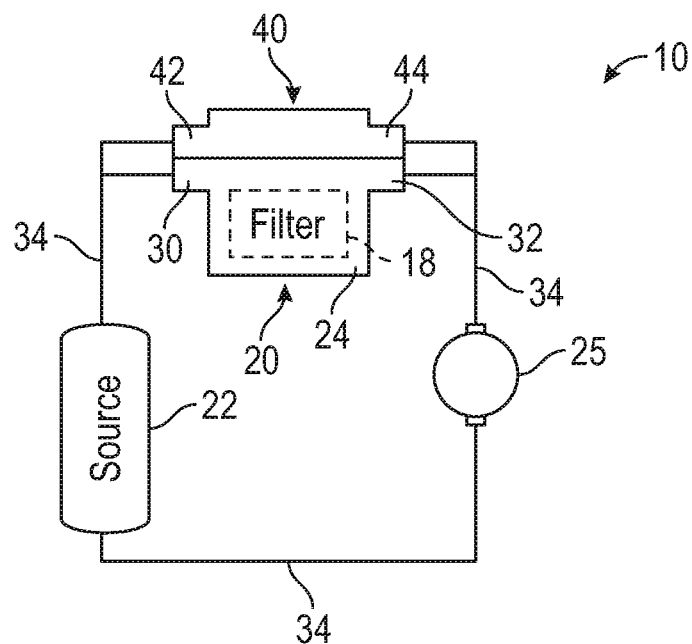
FIG. 1 is a schematic diagram of a cooling system including a cooling device for drawing heat from an electromagnetic interference filter according to an exemplary embodiment.

Referring to FIG. 1, a schematic diagram of an exemplary cooling system 10 for an electromagnetic interference filter 18 is shown. The cooling system 10 includes a cooling device 20, a source 22 of cooling medium, and a pump 25. The pump 25 is fluidly connected to the source 22. The cooling device 20 includes a housing 24 that contains the electromagnetic interference filter 18. The housing 24 also includes an inlet port 30 and an outlet port 32. The inlet port 30 of the housing 24 is fluidly connected to the source 22 by a fluid conduit 34. The fluid conduit 34 also fluidly connects the outlet port 32 of the housing 24 to the pump 25. As explained below, the cooling device 20 is configured to draw heat generated by the electromagnetic interference filter 18.

In the non-limiting embodiment as illustrated in FIG. 1, the cooling device 20 also includes a cap 40. The cap 40 includes a cap inlet port 42 and a cap outlet port 44. The cap inlet port 42 is fluidly connected to the source 22 by the fluid conduit 34. The fluid conduit 34 also fluidly connects the cap outlet port 44 to the pump 25. It is to be appreciated that the cap 40 is an optional component and may be omitted in some embodiments. However, the cap 40 may further enhance or improve cooling of the electromagnetic interference filter 18.

The source 22 is a vessel configured to store the cooling medium. In one embodiment, the cooling medium is a cryogenic fluid. For example, the source 22 may be a cryogenic Dewar flask and the cryogenic fluid is liquid nitrogen. Although liquid nitrogen is described, it is to be appreciated that the cryogenic fluid is not limited to liquid nitrogen. Instead, the particular cryogenic fluid is selected based on the heat loads experienced by a specific application. Alternatively, in another embodiment, the cooling medium may be a non-cryogenic fluid instead. For example, a refrigerant such as Dichlorodifluoromethane (R-12) may be used. Some other examples of a non-cryogenic fluid include, but are not limited to, water (cooled or heated), cooled air, ethylene glycol, fuel, cold gaseous dinitrogen, and cold carbon dioxide. It is to be appreciated that the fluid may refer to liquid or gas. If the cooling medium is a cryogenic fluid, then the pump 25 may also be referred to as a cryopump. The pump 25 is fluidly connected to the cooling device 20 and the source 22 by the fluid conduit 34. The pump 25 includes a cryostat or condenser pump configured to compress and cool gaseous cryogenic fluid received from the cooling device 20 into a liquid state.

Figure 2:
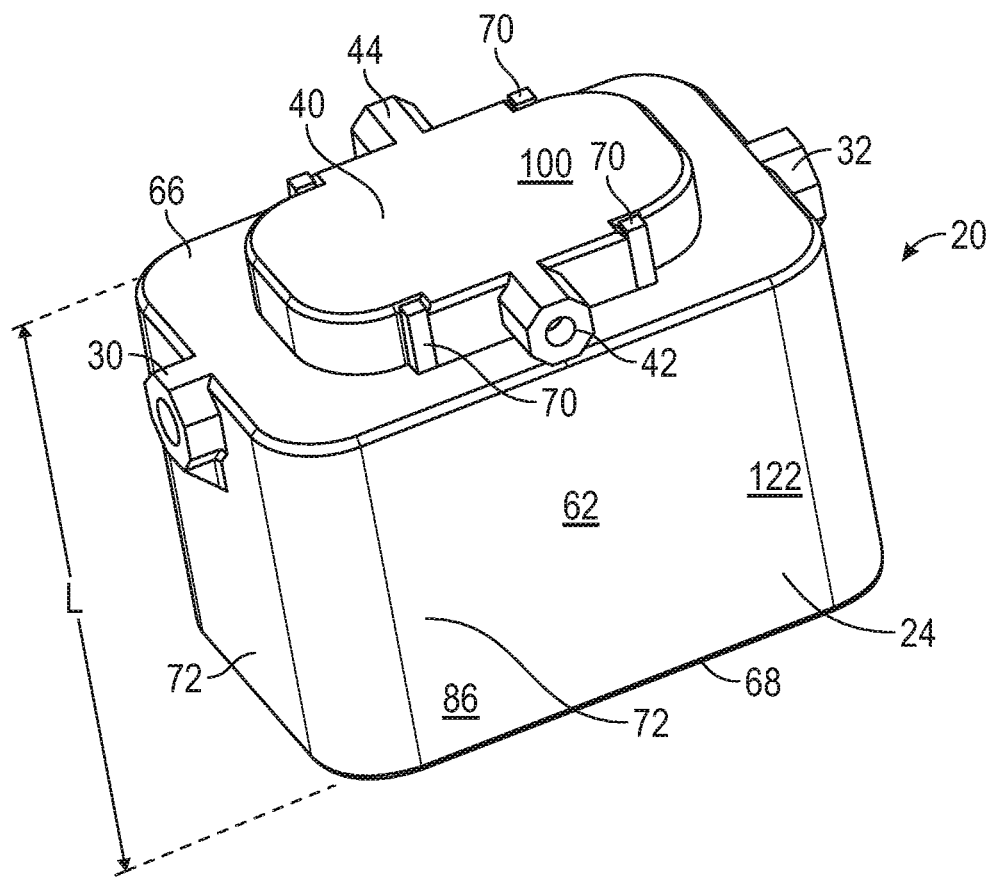
FIG. 2 is an elevated perspective view of the cooling device shown in FIG. 1, where the cooling device further includes a cap according to an exemplary embodiment.
Figure 3:
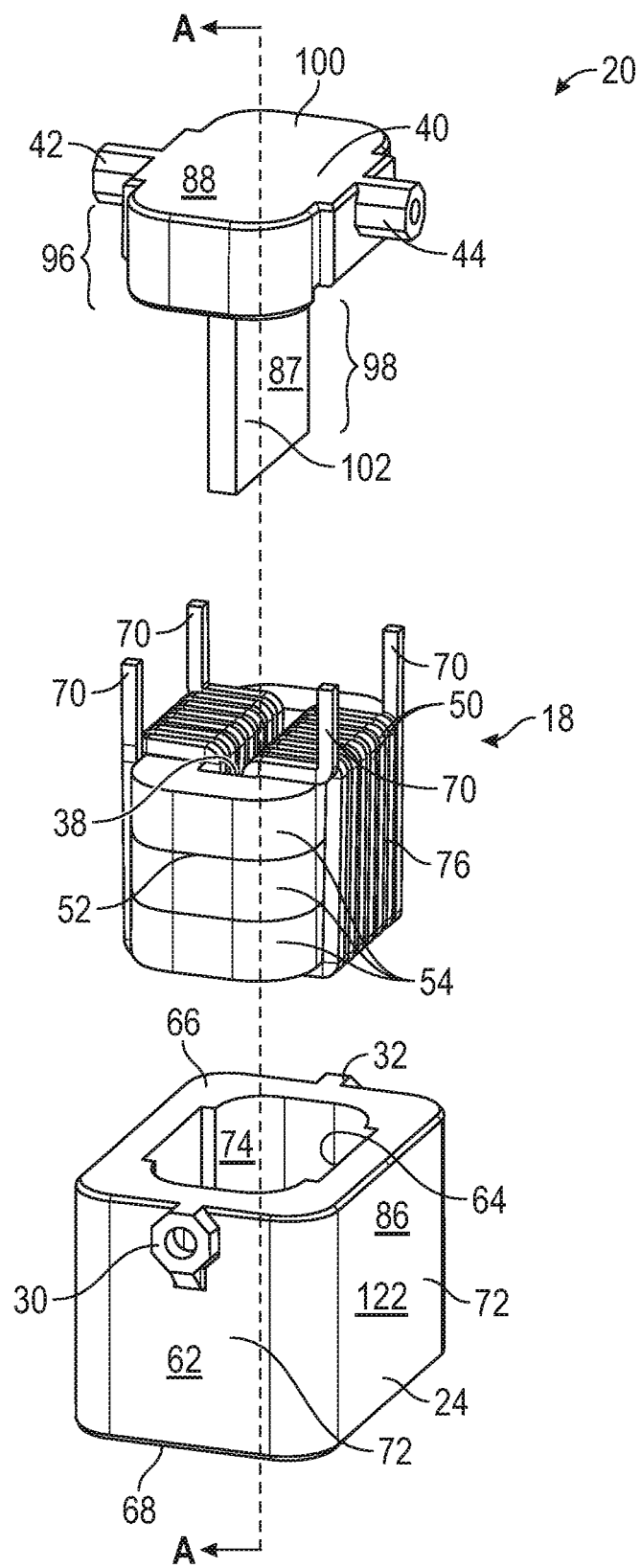
FIG. 3 is an exploded view of the cooling device, the electromagnetic interference filter, and the cap shown in FIG. 2 according to an exemplary embodiment.

FIG. 2 is an elevated perspective view of the cooling device 20 including the cap 40. FIG. 3 is an exploded view of the cooling device 20 shown in FIG. 2, where the electromagnetic interference filter 18 is visible. Referring specifically to FIG. 3, the electromagnetic interference filter 18 includes one or more inductors 50, which are also referred to as chokes, that are conductive wires. The electromagnetic interference filter 18 also includes a magnetic core 52. The inductors 50 are wrapped around the magnetic core 52. Current passes through the inductors 50 from a power source (not shown) and to a load (not shown). The inductors 50 allow for lower frequency current to pass through to the load but block higher frequency current. However, the inductors 50 dissipate the higher frequency current as heat. Accordingly, the cooling system 10 and the cooling device 20 are provided to draw the heat generated by the electromagnetic interference filter 18, thereby reducing the temperature of the electromagnetic interference filter 18. As explained below, a cooling medium that is provided by the source 22 flows through the cooling device 20 to draw the heat generated by the inductors 50 of the electromagnetic interference filter 18.

Figure 4:
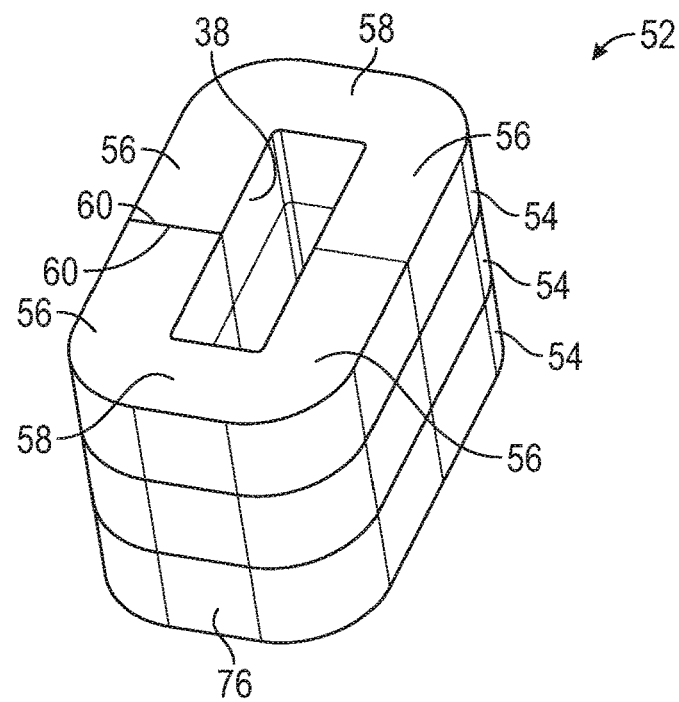
FIG. 4 is a perspective view of the magnetic core shown in FIG. 3 according to an exemplary embodiment.
Figure 6:
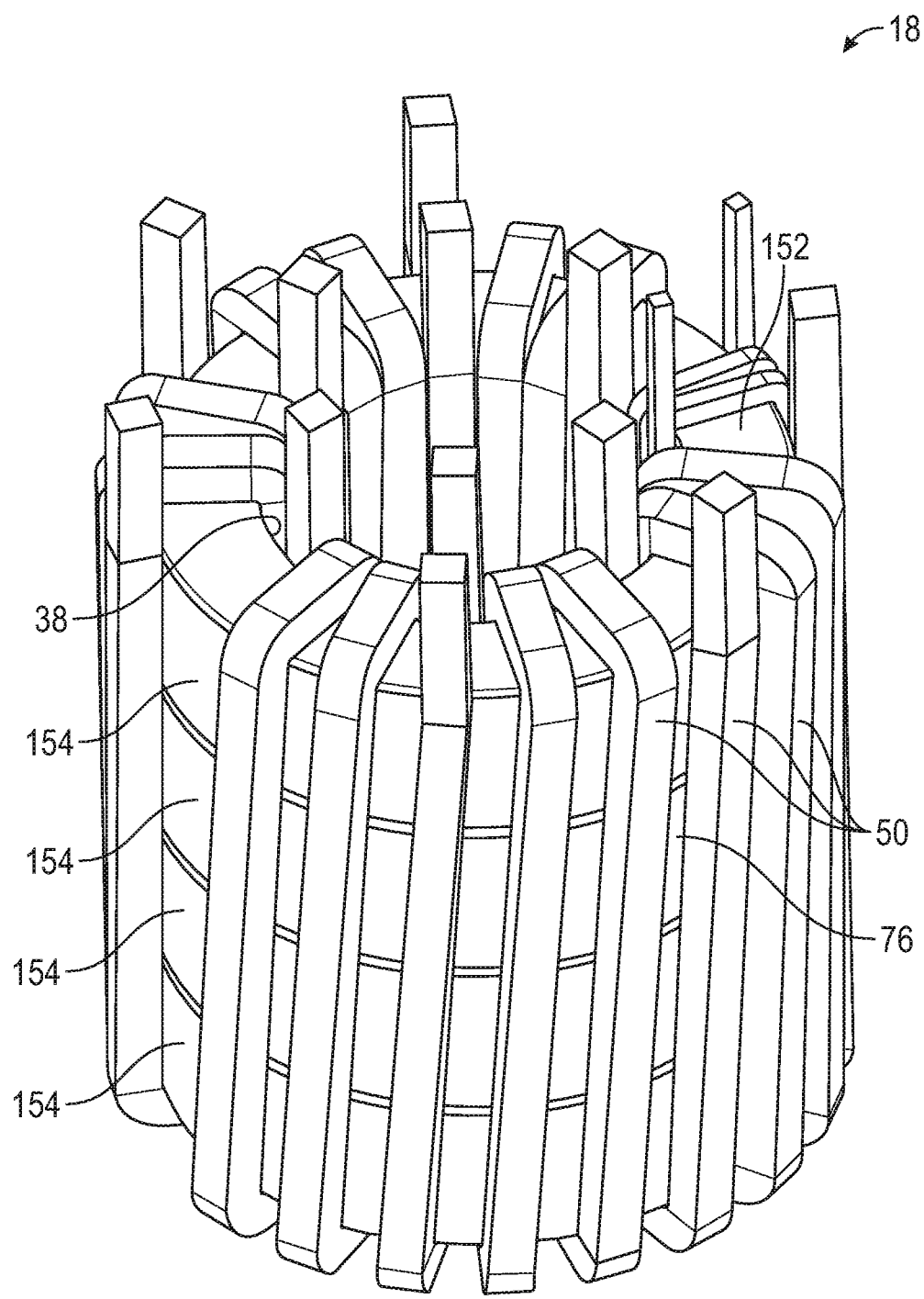
FIG. 6 is a perspective view of another embodiment of the electromagnetic interference filter having a toroidal magnetic core according to an exemplary embodiment.

In some embodiments, the magnetic core 52 is constructed of multiple magnetic cores 54. Specifically, in the example as shown in FIG. 4, the magnetic cores 54 are horseshoe style magnetic cores (i.e., U-shaped magnetic cores) that include two side bars 56 and an arcuate end portion 58 that joins the side bars together. The magnetic cores 54 are joined together at their respective end faces 60 to create the magnetic core 52. The magnetic core 52 also defines a centrally located aperture 38. It is to be appreciated that the embodiment shown in FIGS. 3 and 4 is merely exemplary in nature, and the magnetic core 52 may include any number of shapes or profiles. For example, in the alternative embodiment as shown in FIG. 6, the magnetic core 52 includes a toroidal shape instead.

Referring to FIGS. 2 and 3, the housing 24 of the cooling device 20 includes a main body 62 having a cavity 64 shaped to receive the electromagnetic interference filter. Specifically, the entire magnetic core 52 of the electromagnetic interference filter 18 fits within the cavity 64 of the housing 24. The inductors 50 wrapped around the magnetic core 52 are also received completely within the cavity 64 of the housing 24. However, as seen in FIG. 2, a portion 70 of the inductors 50 that are not wrapped around the magnetic core 52 project in an upward direction and protrude from the cavity 64 of the housing 24. The portion 70 of the inductors 50 exposed to the environment act as busbars and electrically connect the electromagnetic interference filter 18 to an electrical circuit (not shown).

The main body 62 of the housing 24 includes the upper face 66 and a lower face 68. The cavity 64 in the main body 62 of the housing 24 is disposed along the upper face 66 of the main body 62. In the non-limiting embodiment as illustrated, both the inlet port 30 and the outlet port 32 of the housing 24 are disposed along the upper face 66. However, it is to be appreciated that the inlet port 30 and the outlet port 32 may be oriented along the housing 24 in a variety of different arrangements. For example, in another embodiment the inlet port 30, the outlet port 32, or both the inlet port 30 and the outlet port 32 may be located along the lower face 68 of the housing 24. In yet another embodiment, the inlet port 30, the outlet port 32, or both the inlet port 30 and the outlet port 32 are located along a side 72 of the housing 24 between the upper face 66 and the lower face 68.

Referring specifically to FIG. 3, the cavity 64 in the main body 62 of the housing 24 is defined by an inner wall 74. The inner wall 74 is shaped to substantially correspond with an outermost surface 76 defined by both the magnetic core 52 and the inductors 50 of the electromagnetic interference filter 18. Therefore, when the electromagnetic interference filter 18 is placed within the cavity 64 of the main body 62 of the housing 24, the inner wall 74 that defines the cavity 64 substantially contacts the outermost surface 76 of the electromagnetic interference filter 18. As cryogenic fluid passes through one or more cooling channels 80 that are located completely within the housing 24 (shown in FIG. 5), the contact between the inner wall 74 of the housing 24 and the outermost surface 76 of the electromagnetic interference filter 18 draws heat away from the electromagnetic interference filter 18.

In an embodiment, the housing 24 as well as the cap 40 are both constructed by additive manufacturing techniques, which is also referred to as 3D printing. The housing 24 and the cap 40 are both constructed of a material that is compatible with the specific type of cryogenic fluid that is employed by the cooling device 20. For example, if the cryogenic fluid is liquid nitrogen, then the material employed by the housing 24 and the cap 40 is compatible with liquid nitrogen. Some examples of materials that may be used by the housing 24 and the cap 40 include, but are not limited to, polyetherimide, polyether ether ketone (PEEK), and polyetherketoneketone (PEKK).

In one non-limiting embodiment, an outermost surface 86 of the housing 24 is coated or painted with a structural primer paint. An outermost surface 88 of the cap 40 may also be painted with the structural primer as well. For example, the structural primer paint may be a two-component epoxy polyamide primer that is also utilized for protecting an aircraft. The structural primer paint creates a barrier or seal that substantially eliminates any fluid leaks within the cooling device 20.

Figure 5:
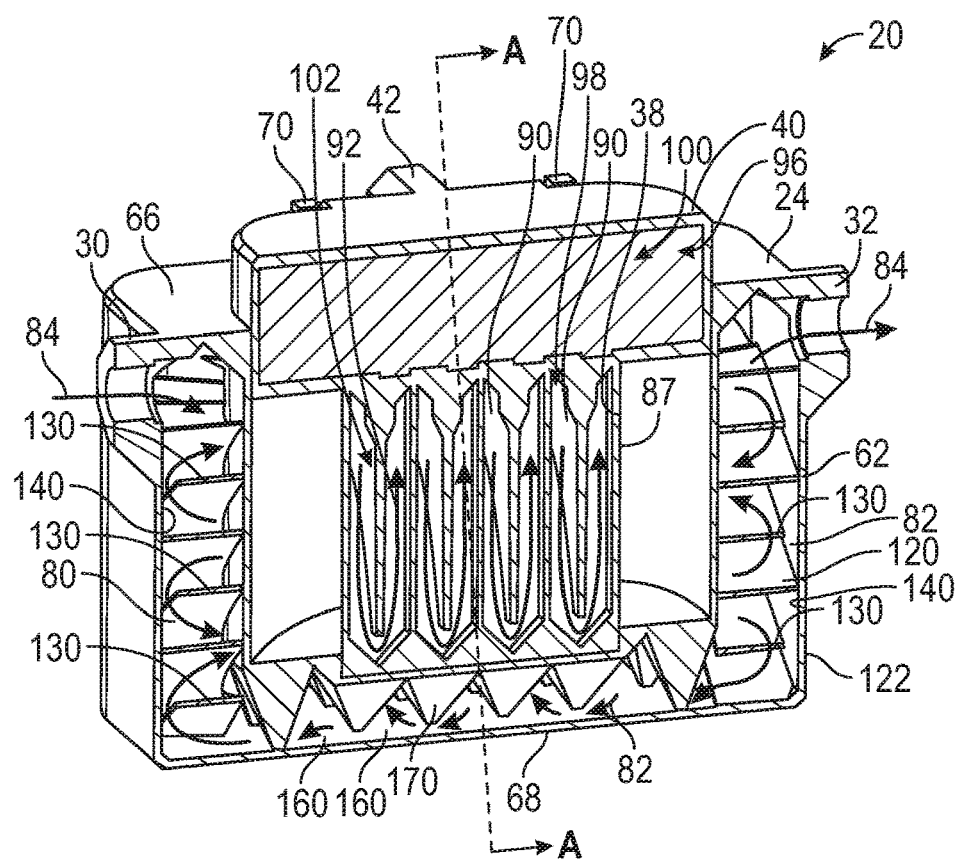
FIG. 5 is a cross-sectioned view of the cooling device, the electromagnetic interference filter, and the cap shown in FIG. 2 according to an exemplary embodiment.

FIG. 5 is a cross-sectioned view of the cooling device 20 shown in FIGS. 2 and 3, which reveals one or more cooling channels 80 that surround at least a portion of the cavity 64 in the main body 62 of the housing 24. The cooling channels 80 fluidly connect the inlet port 30 to the outlet port 32, where the cooling medium (i.e., the cryogenic fluid) flows into the inlet port 30, through the cooling channels 80, and exits the housing 24 through the outlet port 32 of the housing 24. The cooling medium draws heat generated by the electromagnetic interference filter 18 as the cooling medium flows through the cooling channels 80. The cooling channels 80 define one or more flow paths 82 that are contained completely within the housing 24. In other words, a complete cooling circuit may be defined between the housing 24, the source 22 of cooling medium, and the pump 25 (FIG. 1).

Thus, it is to be appreciated that the cooling device 20 is a self-contained monolithic cooling unit, which in turn reduces or substantially eliminates occurrences of leaks that sometimes occur when cooling medium flows between multiple components that are joined together.

The cooling channels 80 are arranged in either a series configuration or a parallel configuration, where the specific configuration is determined based on the specific cooling requirements of the electromagnetic interference filter 18. It is to be appreciated that characteristics of the cooling medium such as, for example, flow rate and Reynolds number (i.e., to determine if the flow is laminar or turbulent) depend upon whether the cooling channels 80 are arranged in the series or the parallel configuration.

In the embodiment as shown, the one or more cooling channels 80 extend along an entire length L of the main body 62 of the housing 24. Referring to FIG. 2, the entire length L of the main body 62 is measured between the upper face 66 and the lower face 68 of the housing 24. It is to be appreciated that in another embodiment the cooling channels 80 may not extend along the entire length L of the main body 62 of the housing 24. However, having the cooling channels 80 extend along the entire length L of the main body 62 of the housing 24 may increase or provide more uniform cooling to the electromagnetic interference filter 18.

Referring to FIG. 5, in one embodiment the housing 24 also includes one or more peripheral cooling channels 120 that are defined in part by an outermost wall 122 of the housing 24. In the embodiment as shown in FIG. 5, the cooling channels 80 are also labeled as the peripheral cooling channels 120, however it is to be appreciated that in another embodiment there may be separate peripheral cooling channels 120 instead. Furthermore, FIG. 5 also illustrates the cooling channels 80 including a spiral configuration. Specifically, the cooling channels 80 are arranged in a winding pattern around the central axis A-A of the housing 24. Although a spiral configuration is described, it is to be appreciated that the disclosure is not limited to this particular configuration.

Continuing to refer to FIG. 5, in an embodiment one or more cooling fins 130 are disposed within the cooling channels 80. Specifically, FIG. 5 illustrates the one or more cooling fins 130 disposed within the peripheral cooling channels 120. The cooling fins 130 are projections located along an inner surface 140 of the peripheral cooling channels 120 and are used to increase a surface area of the housing 24 used to draw heat from the electromagnetic interference filter 18. Therefore, the cooling fins 130 may further improve or enhance cooling of the electromagnetic interference filter 18.

In an embodiment, the housing 24 includes one or more bottom cooling channels 160 defined in part by the lower face 68 of the housing 24. The bottom cooling channels 160 may further enhance cooling of the electromagnetic interference filter 18 by drawing heat from a bottom portion 162 of the electromagnetic interference filter 18. Specifically, the bottom cooling channels 160 are defined by a plurality of support structures 170 that are disposed within the one or more bottom cooling channels 160. Each support structure 170 includes a tapered profile that diverges in an opposite direction from the lower face 68 of the housing 24. It is to be appreciated that the tapered profile of the support structures 170 in the event the cooling device 20 is manufactured using additive manufacturing techniques (i.e., 3D printing). This is because the housing 24 of the cooling device 20 is generally constructed bottom to top, and the tapered profile of the support structures 170 results in reduced or almost no sacrificial material required to build the bottom cooling channels 160. In other words, the housing 24 is constructed by first creating the lower face 68 and then adding material in an upwards direction.

The cap 40 of the cooling device 20 is now described. Referring to FIGS. 3 and 5, in one embodiment a portion 98 of the cap 40 is shaped to extend into the cavity 64 of the main body 62 of the housing 24. The cap 40 includes a head 100 and a stem 102, where the head 100 is shaped to cover the cavity 64 of the housing 24 and the stem 102 includes an elongated profile that serves as the portion 98 of the cap 40 that extends into the cavity 64 of the housing 24. A portion 96 of the head 100 of the cap 40 extends out of the cavity 64 of the main body 62 of the housing 24, while the stem 102 extends into the cavity 64 of the main body 62 of the housing 24 along the central axis A-A of the housing 24.

Referring specifically to FIG. 5, the cap 40 includes one or more internal cooling channels 90 that are disposed within the stem 102 of the cap 40. The one or more internal cooling channels 90 define internal flow paths 92. It is to be appreciated that the internal flow paths 92 of the internal cooling channels 90 are separate from the flow paths 82 of the housing 24. In other words, the cooling medium flowing through the housing 24 does not intermingle with the cooling medium flowing through the cap 40. The internal flow paths 92 of the one or more internal cooling channels 90 extends into the stem of the cap 40. Referring to FIGS. 3, and 5, the stem 102 of the cap 40 extends into the centrally located aperture 38 defined by the magnetic core 52 of the electromagnetic interference filter 18, where an outermost surface 87 of the stem 102 is shaped to correspond with the outermost surface 76 of the electromagnetic interference filter 18 around the centrally located aperture 38.

As mentioned above, the magnetic core 52 may include any number of different configurations and shapes and is not limited to the embodiments shown in the figures. Referring now to FIG. 6, an alternative embodiment of the electromagnetic interference filter 18 having a toroidal magnetic core 152 is illustrated. In the embodiment as shown, the toroidal magnetic core 152 is constructed of multiple magnetic cores 154. Specifically, in the example as shown in FIG. 6, the magnetic cores 154 are ring shaped magnetic cores that are stacked on top of one another to create the toroidal shape.

Figure 7:
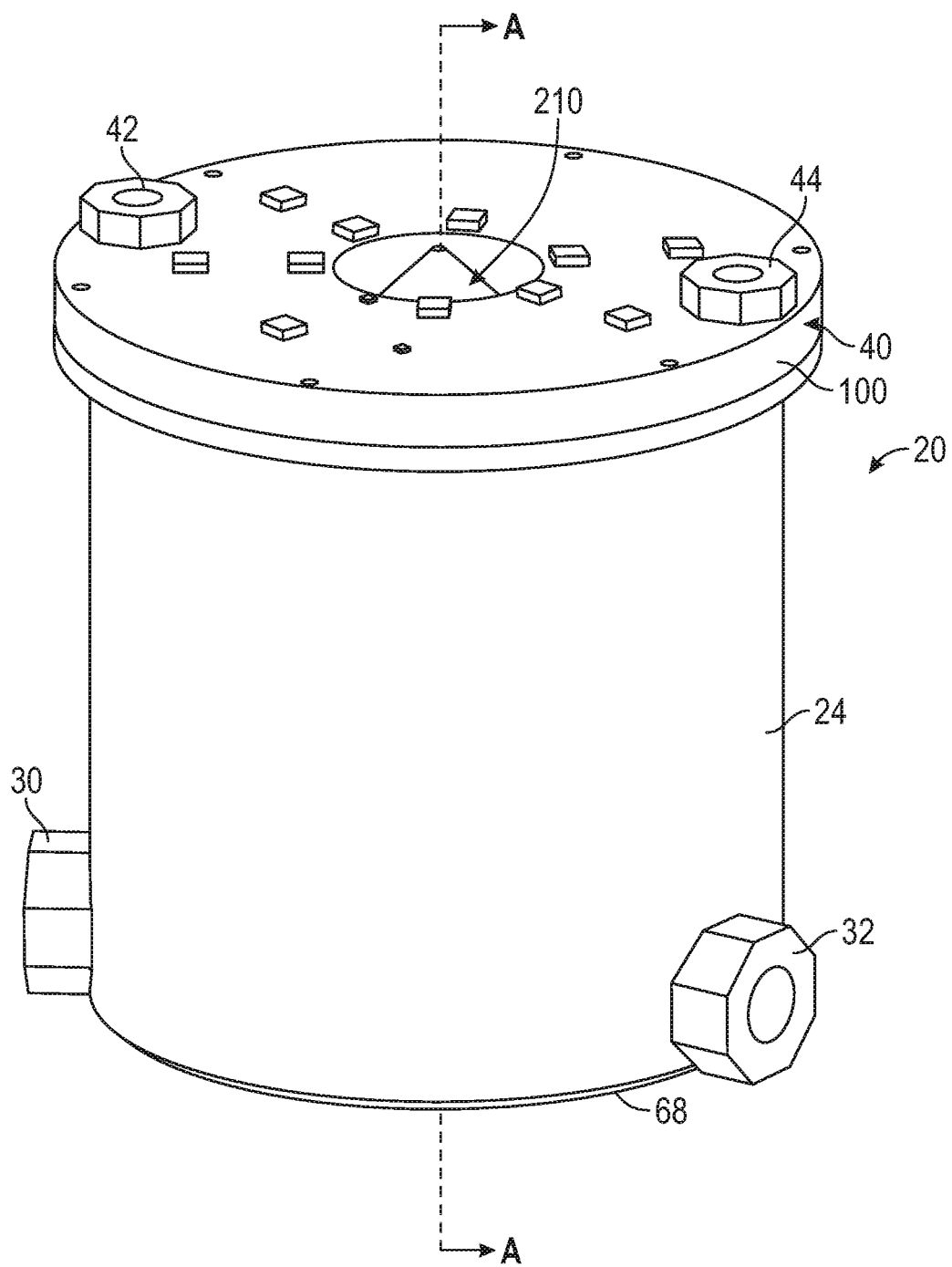
FIG. 7 is a perspective view of another embodiment of the cooling device and the cap, where the cooling device and the cap are both for drawing heat from the toroidal magnetic core as shown in FIG. 6 according to an exemplary embodiment.
Figure 8:
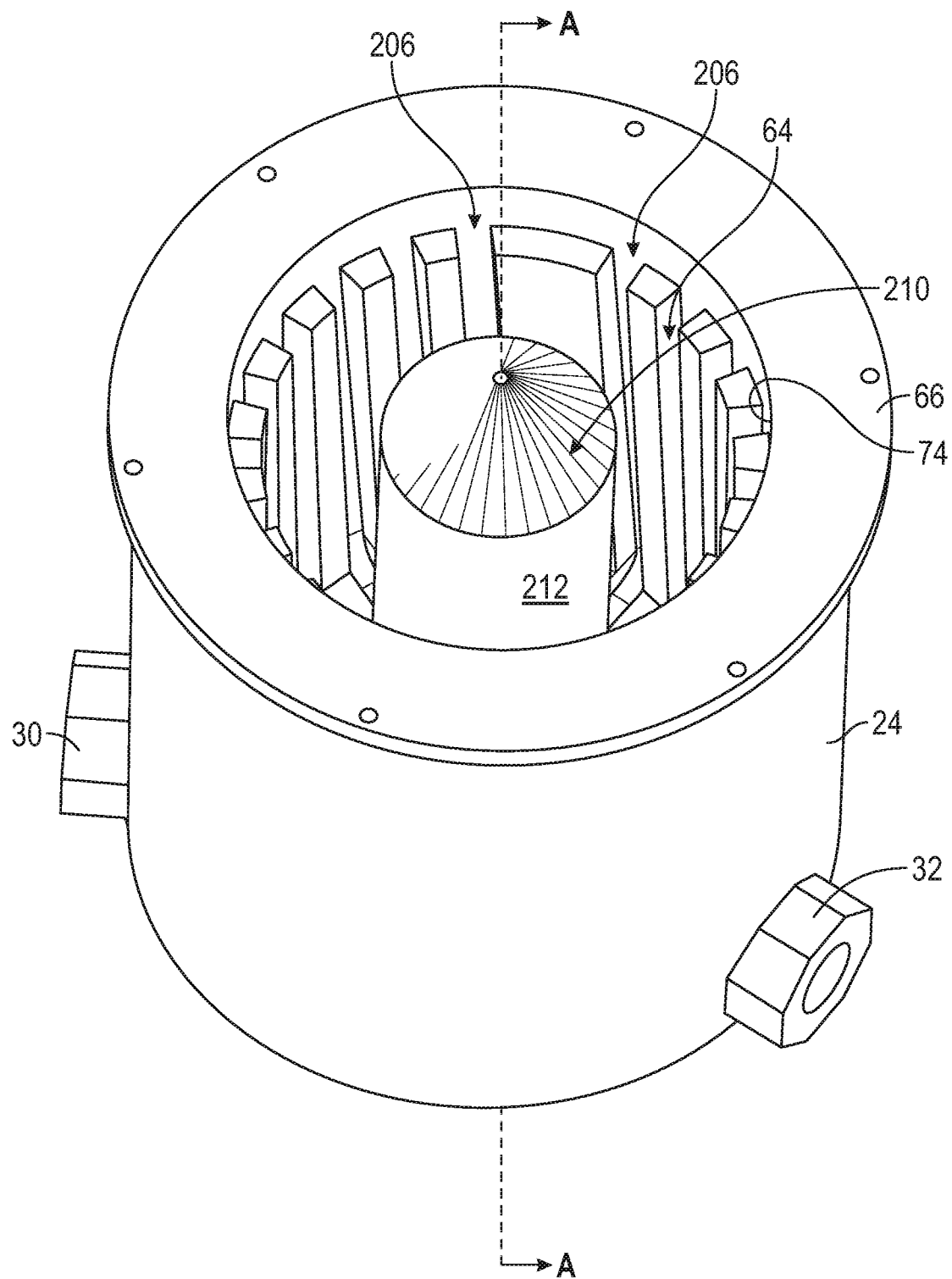
FIG. 8 is a perspective view of the cooling device shown in FIG. 7 according to an exemplary embodiment.

FIG. 7 is a perspective view of the cooling device 20 that provides cooling for the toroidal magnetic core 152 shown in FIG. 6. In the embedment as shown in FIG. 7, the housing 24 of the cooling device 20 includes a substantially cylindrical profile. Furthermore, the embodiment shown in FIG. 7 also illustrates the inlet port 30 and the outlet port 32 located along the lower face 68 of the housing 24 instead of the upper face 66 as seen in the embodiment of FIG. 2. FIG. 8 illustrates the housing 24 where the cap 40 is removed. Since the cap 40 is removed, the inner wall 74 of the cavity 64 in the main body 62 of the housing 24 is visible in FIG. 7.

Referring now to FIGS. 6 and 8, the inner wall 74 of the housing 24 is shaped to substantially correspond with the outermost surface 76 of the electromagnetic interference filter 18. Specifically, in the embodiment as shown, the inner wall 74 of the housing 24 includes a plurality of depressions 206 that are each shaped to accommodate one of the inductors 50 wrapped around the toroidal magnetic core 152. Furthermore, as seen in FIG. 9, an inner surface 202 of the cap 40 also includes a plurality of depressions 204 that are also shaped to accommodate one of the inductors 50 of the toroidal magnetic core 152.

Figure 9:
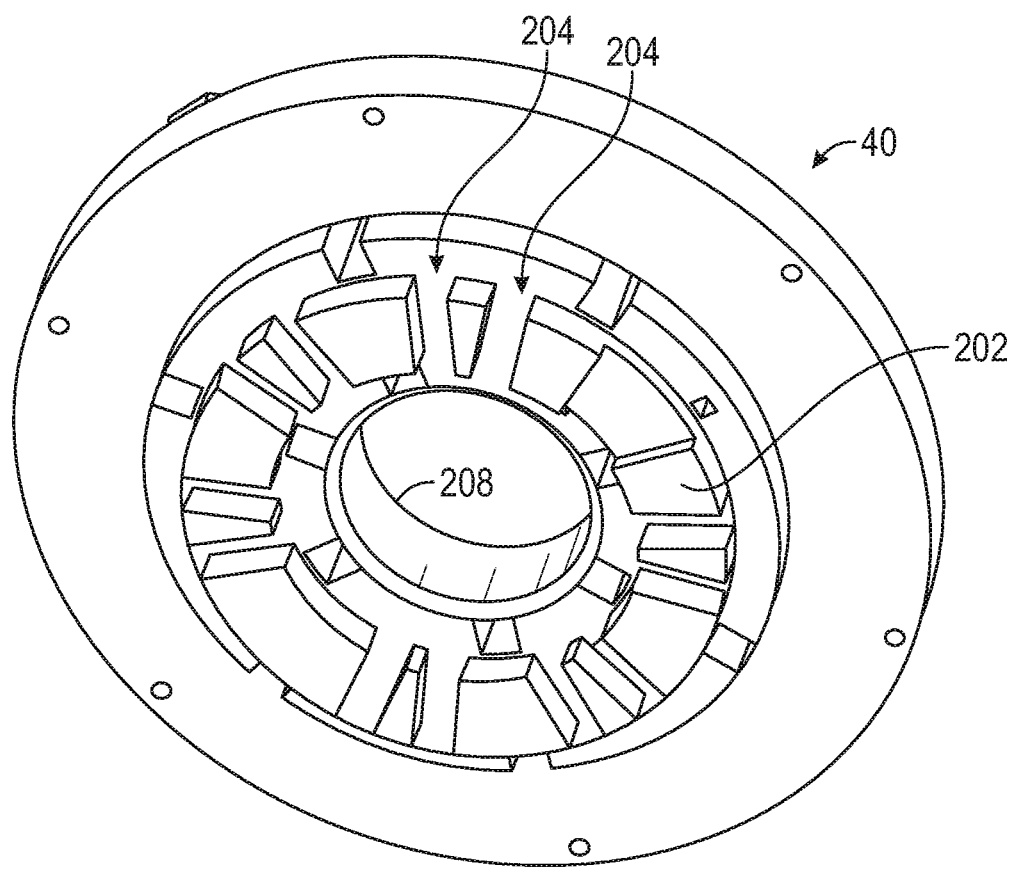
FIG. 9 is a perspective view of the cap shown in FIG. 7 according to an exemplary embodiment.

In the embodiment as shown in FIG. 9, the cap 40 does not include the stem 102 (i.e., the stem 102 shown in FIG. 2). Instead, the cap 40 includes a centrally located aperture 208. The centrally located aperture 208 is centered around the central axis A-A of the cooling device 20. Referring to FIGS. 7, 8, and 9, the centrally located aperture 208 of the cap 40 is shaped to receive a stem 210 that is part of the housing 24. The stem 210 of the housing 24 defines a surface 212 that is shaped to correspond with the outermost surface 76 of the centrally located aperture 38 of the electromagnetic interference filter 18.

Figure 10A:
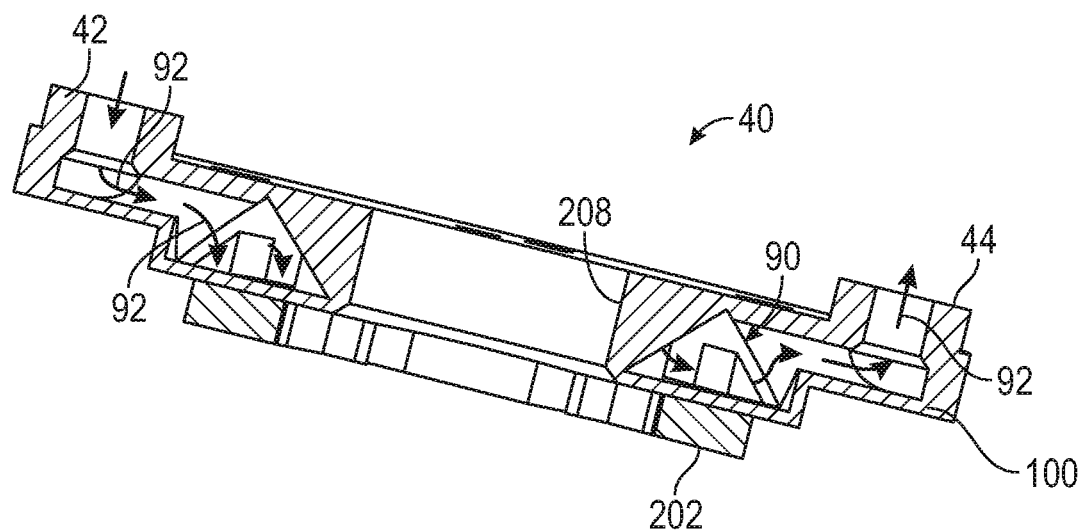
FIG. 10A is a cross-sectioned view of the cap shown in FIG. 9 according to an exemplary embodiment.
Figure 10B:
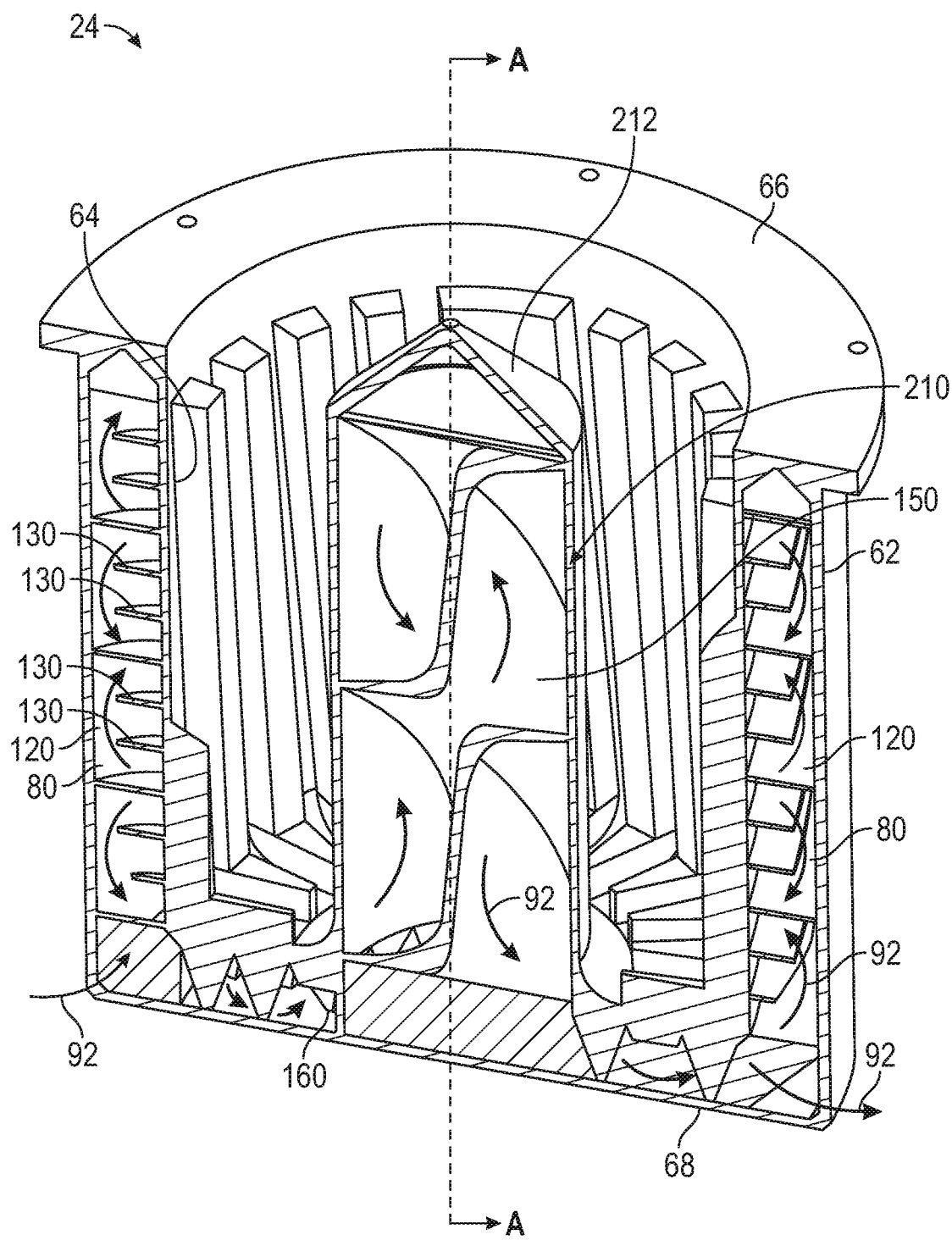
FIG. 10B is a cross-sectioned view of the housing shown in FIG. 8 according to an exemplary embodiment.

FIGS. 10A and 10B illustrate cross-sectioned views of the cap 40 seen in FIG. 9 and the housing 24 seen in FIG. 7, respectively. Referring to FIGS. 9 and 10A, the cap 40 includes one or more internal cooling channels 90 that fluidly connect the cap inlet port 42 to the cap outlet port 44. Similar to the embodiment as shown in FIG. 5, the one or more internal cooling channels 90 shown in FIG. 10A define internal flow paths 92 that are separate from the flow paths 82 of the housing 24 (seen in FIG. 10B). The internal cooling channels 90 illustrated in FIG. 10A extend within the head 100 of the cap 40, since the cap 40 shown in FIG. 10A does not include a stem portion.

In the embodiment as shown in FIG. 10B, the stem 210 of the housing 24 includes one or more central cooling channels 150. The central cooling channels 150 extend around the central axis A-A of the housing 24. As seen in FIG. 10B, the flow path 82 of the cooling channels 80 now include the central cooling channels 150. In the embodiment as shown, the central cooling channels 150 include a spiral configuration, however it is to be appreciated that other shapes and configurations may be used as well. Therefore, when the electromagnetic interference filter 18 (FIG. 6) is placed within the cavity 64 of the main body 62 of the housing 24, the surface 212 of the stem 210 of the housing 24 substantially contacts the outermost surface 76 of the electromagnetic interference filter 18 around the centrally located aperture 38. Thus, cooling medium flows through the central cooling channels 150 to draw away heat generated around the centrally located aperture 38 of the electromagnetic interference filter 18.

In the embodiment as shown in FIG. 10A, the central cooling channels 150 are fluidly connected to the cooling channels 80 as well as the bottom cooling channels 160 of the housing 24. Thus, the central cooling channels 150 are fluidly connected to both the inlet port 30 and the outlet port 32 of the housing 24. It is to be appreciated that similar to the embodiment as shown in FIG. 5, the cooling channels 80 of the housing 24 shown in FIG. 10A also serve as the peripheral cooling channels 120 of the housing 24. Moreover, the peripheral cooling channels 120 in FIG. 10B also include one or more cooling fins 130 disposed within the peripheral cooling channels 120.

Figure 11:
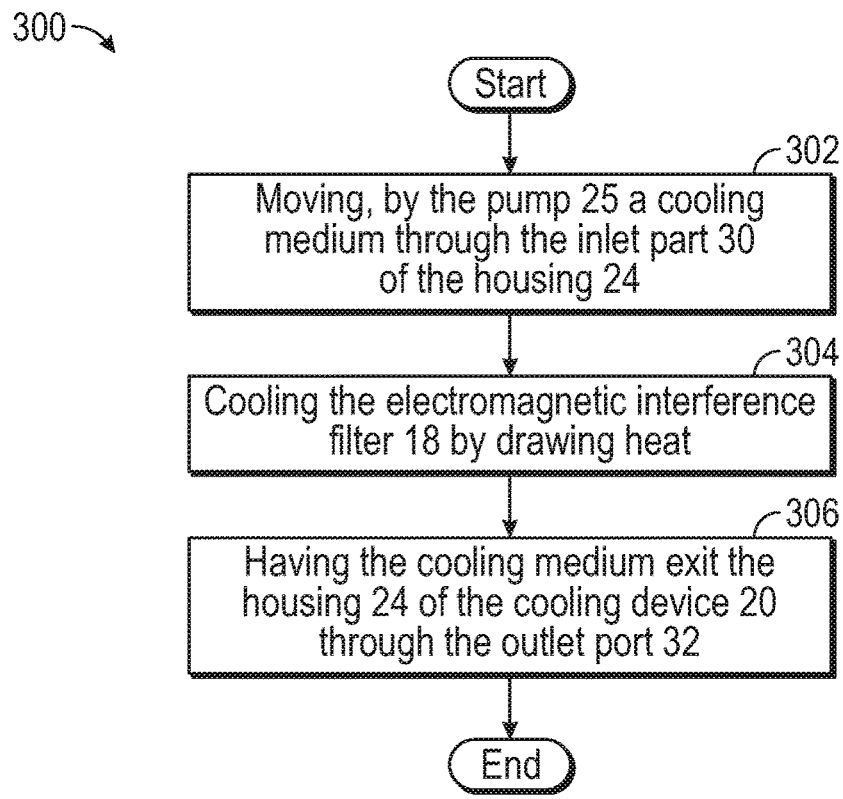
FIG. 11 is a process flow diagram illustrating a method for providing cooling to the electromagnetic interference filter by the disclosed cooling device according to an exemplary embodiment.
Figure 12:
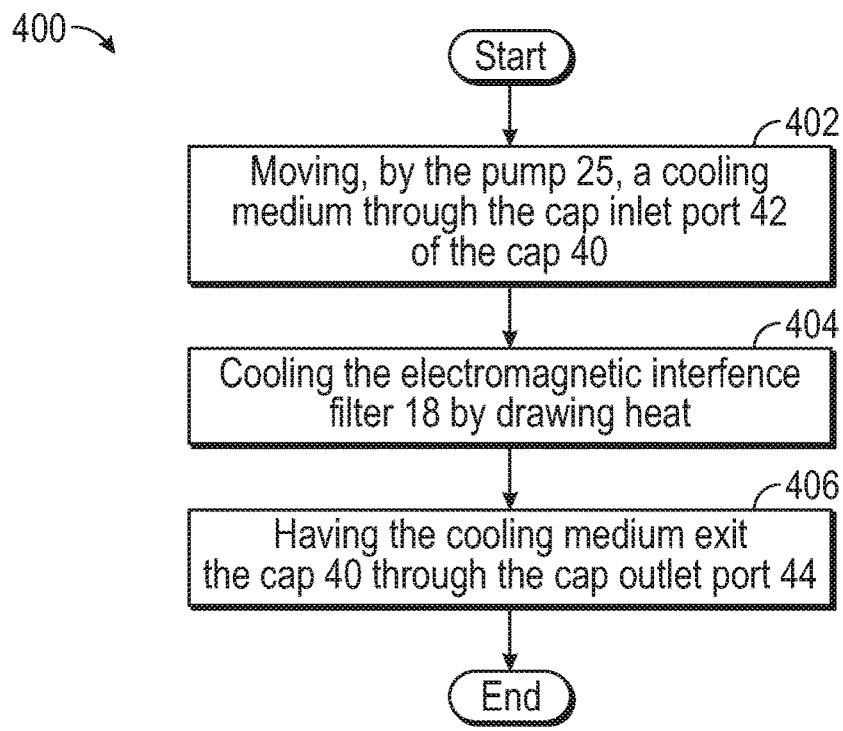
FIG. 12 is a process flow diagram illustrating a method for providing cooling to the electromagnetic interference filter by the disclosed cap according to an exemplary embodiment.

Referring now to FIGS. 11 and 12, process flow diagrams illustrating exemplary methods 300 and 400 are shown. Specifically, FIG. 11 illustrates the method 300 of cooling the electromagnetic interference filter 18 by the housing 24, while FIG. 12 illustrates the method 400 of cooling the electromagnetic interference filter 18 by the cap 40. It is to be appreciated that the method 300 may be performed along, or in conjunction with method 400.

The method 300 is first described. Referring to generally to FIGS. 1-3, 4-5, and 7-11, the method 300 begins at block 302. In block 302, the method 300 includes moving, by the pump 25, a cooling medium into the inlet port 30 of the housing 24 that is part of the cooling device 20. Referring specifically to FIG. 1, the pump 25 is fluidly connected to the source 22 of cooling medium. As seen in FIGS. 3 and 10A, the housing 24 of the cooling device 20 includes the cavity 64 that receives the electromagnetic interference filter 18. The method 300 may then proceed to block 304.

In block 304, the method 300 includes cooling the electromagnetic interference filter 18 by drawing heat generated by the electromagnetic interference filter 18. The heat is drawn as the cooling medium flows through one or more cooling channels 80 located completely within the housing 24 of the cooling device 20. The one or more cooling channels 80 at least partially surround the cavity 64 of the housing 24. The method 300 may then proceed to block 306.

In block 306, the method 300 includes having the cooling medium exit the housing 24 of the cooling device 20 through an outlet port 32. The method 300 may then terminate.

The method 400 in FIG. 12 is now described. Referring to generally to FIGS. 1-3, 4-5, 7, and 12, the method 400 begins at block 402. In block 402, the method 400 includes moving, by the pump 25 (FIG. 1), the cooling medium into the cap inlet port 42 of the cap 40. The method 400 may then proceed to block 404.

In block 404, the method includes cooling the electromagnetic interference filter 18 by drawing the heat generated by the electromagnetic interference filter 18. The heat is drawn as the cooling medium flows through one or more internal cooling channels 90 of the cap 40 (FIGS. 5 and 9). The method 400 may then proceed to block 406.

In block 406, the method 400 includes having the cooling medium exit the cap 40 through a cap outlet port 44. The method 400 may then terminate.

Referring generally to the figures, the disclosures relates to a self-contained monolithic cooling device for an electromagnetic interference filter that does not require multiple components. The self-contained design eliminates any potential leaks that may form between mating surfaces when multiple components are employed. Additionally, the self-contained cooling device improves dispersion of cryogenic fluid which in turn provides a more uniform cooling of the electromagnetic interference filter. The disclosed cooling device is made based on additive manufacturing techniques that result in a reduced amount of sacrificial material when compared to conventional techniques presently used to fabricate electromagnetic interference filters. In one embodiment, the cooling device may include a cap that further enhances or improves cooling of the electromagnetic interference filter as well.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A cooling device for an electromagnetic interference filter, the cooling device comprising:
    a housing, comprising:
        a main body having a cavity defined by an inner wall, wherein the inner wall of the main body is shaped to receive the electromagnetic interference filter;
        one or more cooling channels surrounding at least a portion of the cavity in the main body of the housing, wherein the one or more cooling channels define one or more flow paths that are contained completely within the housing;
        an inlet port; and
        an outlet port, wherein the one or more cooling channels fluidly connect the inlet port to the outlet port and a cooling medium is configured to flow into the inlet port, through the one or more cooling channels, and exit the housing through the outlet port, and wherein contact between the inner wall of the main body of the housing and the electromagnetic interference filter draws heat away from the electromagnetic interference filter as the cooling medium passes through the one or more cooling channels.

2. The cooling device of claim 1, wherein the main body of the housing includes an upper face and a lower face, and wherein the cavity in the main body of the housing is disposed along the upper face.

3. The cooling device of claim 2, wherein the one or more cooling channels extend along an entire length of the main body, and wherein the entire length of the main body is measured between the upper face and the lower face.

4. The cooling device of claim 1, further comprising a cap, wherein a portion of the cap is shaped to extend into the cavity of the main body of the housing.

5. The cooling device of claim 4, wherein the cap includes:
    a cap inlet port;
    a cap outlet port; and
    one or more internal cooling channels, wherein the one or more internal cooling channels define internal flow paths that are separate from the flow paths of the housing.

6. The cooling device of claim 5, wherein the cap includes a head and a stem, wherein a portion of the head of the cap extends out of the cavity of the main body of the housing and the stem extends into the cavity of the main body of the housing along a central axis of the housing.

7. The cooling device of claim 6, wherein internal flow paths of the one or more internal cooling channels extends into the stem of the cap.

8. The cooling device of claim 1, wherein the housing includes one or more peripheral cooling channels that are defined in part by an outermost wall of the housing.

9. The cooling device of claim 8, wherein one or more cooling fins are disposed within the one or more peripheral cooling channels.

10. The cooling device of claim 8, wherein the housing includes one or more central cooling channels that extend along a central axis of the housing, and wherein the one or more central cooling channels are fluidly connected to the one or more peripheral cooling channels.

11. The cooling device of claim 1, wherein the housing includes one or more bottom cooling channels defined in part by a lower face of the housing.

12. The cooling device of claim 11, wherein a plurality of support structures are disposed within the one or more bottom cooling channels, and wherein each support structure includes a tapered profile that diverges in an opposite direction from the lower face of the housing.

13. The cooling device of claim 1, wherein the one or more cooling channels are arranged in either a series configuration or a parallel configuration.

14. The cooling device of claim 1, wherein the one or more cooling channels include a spiral configuration.

15. A cooling system, comprising:
    a source of cooling medium;
    a pump fluidly connected to the source of cooling medium;
    an electromagnetic interference filter; and a cooling device configured to provide cooling to the electromagnetic interference filter, wherein the cooling device includes a housing, and wherein the housing comprises:
- a main body having a cavity defined by an inner wall, wherein the inner wall is shaped to receive the electromagnetic interference filter;
- one or more cooling channels that surround at least a portion of the cavity in the main body of the housing, wherein the one or more cooling channels define one or more flow paths that are contained completely within the housing;
- an inlet port fluidly connected to the source of cooling medium; and
- an outlet port, wherein the one or more cooling channels fluidly connect the inlet port to the outlet port, and wherein the pump moves the cooling medium into the inlet port, through the one or more cooling channels, and out of the cooling device through the outlet port, wherein contact between the inner wall of the main body of the housing and the electromagnetic interference filter draws heat away from the electromagnetic interference filter as the cooling medium passes through the one or more cooling channels.

16. The cooling system of claim 15, wherein the cooling medium is a cryogenic fluid.

17. The cooling system of claim 15, further comprising a cap fluidly connected to the source of cooling medium, wherein a portion of the cap is shaped to extend into the cavity of the main body of the housing.

18. The cooling system of claim 17, wherein the cap includes:
- a cap inlet port fluidly connected to the source of cooling medium;
- a cap outlet port fluidly connected to the source of cooling medium; and
- one or more internal cooling channels, wherein the one or more internal cooling channels define internal flow paths that are separate from the flow paths of the housing.

19. A method of cooling an electromagnetic interference filter, the method comprising:
- moving, by a pump, a cooling medium into an inlet port of a housing that is part of a cooling device, wherein the pump is fluidly connected to a source of cooling medium and the housing of the cooling device includes a cavity that receives the electromagnetic interference filter;
- cooling the electromagnetic interference filter by one or more cooling channels located completely within the housing of the cooling device, wherein contact between an inner wall of a main body of the housing and the electromagnetic interference filter draws heat away from the electromagnetic interference filter as the cooling medium passes through the one or more cooling channels, and wherein the one or more cooling channels at least partially surround the cavity of the housing; and
- having the cooling medium exit the housing of the cooling device through an outlet port.

20. The method of claim 19, further comprising:
- moving, by the pump, the cooling medium into a cap inlet port of a cap;
- cooling the electromagnetic interference filter by drawing the heat generated by the electromagnetic interference filter, wherein the heat is drawn as the cooling medium flows through one or more internal cooling channels of the cap; and
- having the cooling medium exit the cap through a cap outlet port.

21. A cooling device for an electromagnetic interference filter, the cooling device comprising:
a housing, comprising:
- a main body having a cavity shaped to receive the electromagnetic interference filter, wherein the main body of the housing includes an upper face and a lower face, and wherein the cavity in the main body of the housing is disposed along the upper face;
- one or more cooling channels surrounding at least a portion of the cavity in the main body of the housing, wherein the one or more cooling channels define one or more flow paths that are contained completely within the housing extend along an entire length of the main body, and wherein the entire length of the main body is measured between the upper face and the lower face;
- an inlet port; and
- an outlet port, wherein the one or more cooling channels fluidly connect the inlet port to the outlet port, and wherein a cooling medium is configured to flow into the inlet port, through the one or more cooling channels, and exit the housing through the outlet port.

22. A cooling device for an electromagnetic interference filter, the cooling device comprising:
a housing, comprising:
- a main body having a cavity shaped to receive the electromagnetic interference filter;
- one or more cooling channels surrounding at least a portion of the cavity in the main body of the housing, wherein the one or more cooling channels define one or more flow paths that are contained completely within the housing;
- an inlet port; and
- an outlet port, wherein the one or more cooling channels fluidly connect the inlet port to the outlet port, and wherein a cooling medium is configured to flow into the inlet port, through the one or more cooling channels, and exit the housing through the outlet port;
a cap, wherein a portion of the cap is shaped to extend into the cavity of the main body of the housing, wherein the cap comprises:
- a cap inlet port;
- a cap outlet port;
- one or more internal cooling channels, wherein the one or more internal cooling channels define internal flow paths that are separate from the flow paths of the housing; and
- a head and a stem, wherein a portion of the head of the cap extends out of the cavity of the main body of the housing and the stem extends into the cavity of the main body of the housing along a central axis of the housing.

23. A cooling device for an electromagnetic interference filter, the cooling device comprising:
a housing, comprising:
- a main body having a cavity shaped to receive the electromagnetic interference filter;
- one or more cooling channels surrounding at least a portion of the cavity in the main body of the housing, wherein the one or more cooling channels define one or more flow paths that are contained completely within the housing;
an inlet port;
an outlet port, wherein the one or more cooling channels fluidly connect the inlet port to the outlet port, and wherein a cooling medium is configured to flow into the inlet port, through the one or more cooling channels, and exit the housing through the outlet port;
one or more peripheral cooling channels that are defined in part by an outermost wall of the housing; and
one or more cooling fins are disposed within the one or more peripheral cooling channels.

24. A cooling device for an electromagnetic interference filter, the cooling device comprising:
a housing, comprising:
a main body having a cavity shaped to receive the electromagnetic interference filter;
one or more cooling channels surrounding at least a portion of the cavity in the main body of the housing, wherein the one or more cooling channels define one or more flow paths that are contained completely within the housing;
an inlet port;
an outlet port, wherein the one or more cooling channels fluidly connect the inlet port to the outlet port, and wherein a cooling medium is configured to flow into the inlet port, through the one or more cooling channels, and exit the housing through the outlet port;
one or more bottom cooling channels defined in part by a lower face of the housing; and
a plurality of support structures are disposed within the one or more bottom cooling channels, and wherein each support structure includes a tapered profile that diverges in an opposite direction from the lower face of the housing.

25. A cooling device for an electromagnetic interference filter, the cooling device comprising:
a housing, comprising:
a main body having a cavity shaped to receive the electromagnetic interference filter;
one or more cooling channels surrounding at least a portion of the cavity in the main body of the housing, wherein the one or more cooling channels define one or more flow paths that are contained completely within the housing, and wherein the one or more cooling channels include a spiral configuration;
an inlet port; and
an outlet port, wherein the one or more cooling channels fluidly connect the inlet port to the outlet port, and wherein a cooling medium is configured to flow into the inlet port, through the one or more cooling channels, and exit the housing through the outlet port.

* * * * *